(12) United States Patent
Tsao (10) Patent No.: US 9,300,281 B2
(45) Date of Patent: Mar. 29, 2016

(54) TRIANGULAR WAVE GENERATING CIRCUIT TO PROVIDE CLOCK SYNCHRONIZATION

(71) Applicant: Elite Semiconductor Memory Technology Inc., Hsinchu Science Park, Hsinchu (TW)

(72) Inventor: Szu-chun Tsao, Su'ao Township, Yilan County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 193 days.

(21) Appl. No.: 14/156,264

(22) Filed: Jan. 15, 2014

(65) Prior Publication Data

US 2015/0200659 A1 Jul. 16, 2015

(51) Int. Cl.
*H03K 4/06* (2006.01)
*H03K 4/50* (2006.01)
*H03K 5/01* (2006.01)
*H03K 4/502* (2006.01)

(52) U.S. Cl.
CPC .................. *H03K 4/50* (2013.01); *H03K 4/502* (2013.01); *H03K 5/01* (2013.01)

(58) Field of Classification Search
CPC ........................................................ H03K 4/50
USPC .................................................. 327/172–177
See application file for complete search history.

(56) References Cited

U.S. PATENT DOCUMENTS

| 6,791,405 B2 * | 9/2004 | Tsuji ....................... H03F 3/217 327/131 |
| 7,746,130 B2 | 6/2010 | Chang |
| 2005/0270008 A1 * | 12/2005 | Kuo ....................... H02M 3/156 323/288 |
| 2013/0335143 A1 * | 12/2013 | Lee .......................... H03K 4/06 330/251 |

FOREIGN PATENT DOCUMENTS

JP 2009246595 A * 10/2009

* cited by examiner

*Primary Examiner* — Sibin Chen
*Assistant Examiner* — Metasebia Retebo
(74) *Attorney, Agent, or Firm* — Juan Carlos A. Marquez; Bacon & Thomas PLLC (57) ABSTRACT

A triangular wave generating circuit incorporates a capacitor, first, second, third, and fourth constant current sources, first and second switching units, a high/low level limiter, a clock generator, and a phase detecting unit. The first and second constant current sources charge the capacitor and the third and fourth constant current sources discharge the capacitor. The phase detecting unit compares an externally supplied clock signal with an internal clock signal and generates first and second phase signals base on a phase difference between the externally supplied clock signal and the internal clock signal. The second switching unit comprises a third switch and a fourth switch. The third switch couples the second constant current source to the capacitor in response to the first phase signal. The fourth switch couples the fourth constant current source to the capacitor in response to the second phase signal.

9 Claims, 9 Drawing Sheets

FIG. 1 (Prior Art)

Problem 1.

$I_2 > I_1$ $I_2 < I_1$

Problem 2.

Non-ideal clock duty cycle

TRIANGULAR WAVE GENERATING CIRCUIT TO PROVIDE CLOCK SYNCHRONIZATION

BACKGROUND OF THE INVENTION

1. Field of the Invention

The present invention relates generally to a triangular wave generating circuit, and more specifically to a triangular wave generating circuit having synchronization with an external clock.

2. Description of the Related Art

A triangular wave generator is used to generate a triangular wave signal by charging or discharging a capacitor. The triangular wave generator can be used in various applications. One common application is for converting an analog audio signal into a pulse signal in a Class-D power amplifier.

Figure 1:
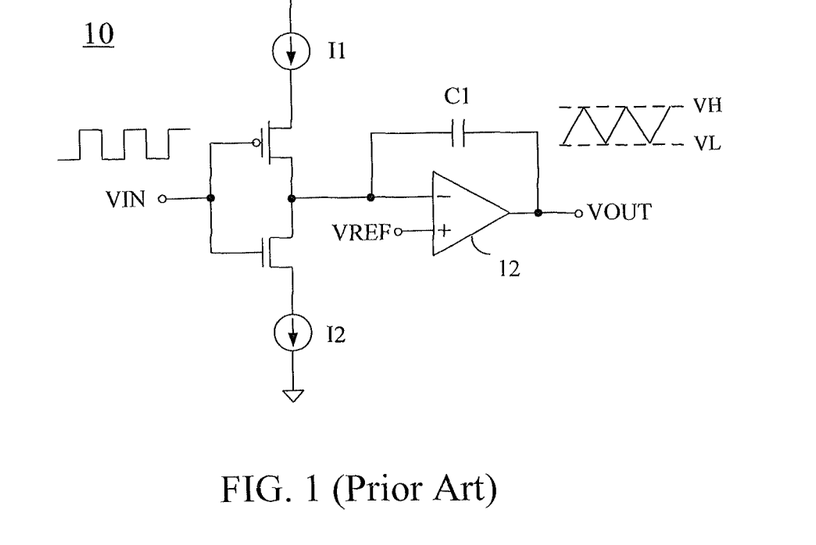
FIG. 1 is a circuit diagram illustrating a prior art circuit for forming a triangular wave from a square wave signal.

FIG. 1 is a circuit diagram illustrating a prior art circuit 10 for forming a triangular wave VOUT from a square wave signal. The performance of this triangular wave can seriously influence the accuracy of applications that utilize the triangular wave, such as pulse width modulation (PWM) applications. The switching frequency fSW of the output triangular wave is equal to 1/(TU+TD) wherein TU is the period of the rise of the triangular wave from VL to VH and TD is the period of the falling of the triangular wave from VH to VL. The "up" period TU is equal to C*(VH−VL)/IC, where C is the capacitance value of the capacitor C1 across the operational amplifier 12, and IC is the charging current from a current source I1. Similarly, the "down" period TD is equal to C*(VH−VL)/ID, where ID is the discharging current from a current source I2 in FIG. 1. Assuming IC is matched to ID, then the frequency fSW is equal to IC/(2*C*(VH−VL)). From this equation, it is known that the switching frequency of the triangular wave is directly proportional to the charging and discharging currents and inversely proportional to the triangular wave swing.

Figure 2:
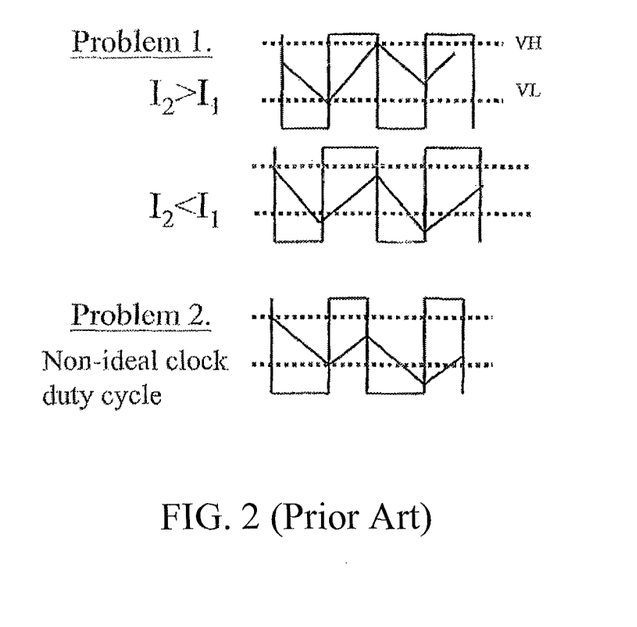
FIG. 2 illustrates potential problems with the triangular wave generators such as the generator of FIG. 1.

FIG. 2 illustrates potential problems with the triangular wave generators such as the generator 10 of FIG. 1. For example, as shown in "Problem 1" of FIG. 2, the triangular wave does not vary between the desired peak limits VH and VL if the current sources are not matched, i.e., if current source I2>I1 or current source I1<I2. Similarly, "Problem 2" illustrates that this same issue arises if the square wave signal does not have an ideal duty cycle. The second problem is frequently found when the internal clock pulse is not synchronized to an external clock source. Synchronizing an internal clock to an external clock is important in, for example, multiple class D amplifier applications, such a 5.1 channel or 7.1 channel audio systems. If the switching frequency is not the same, a beat frequency will occur in the audio band.

Therefore, there is a need to provide a circuit to solve the above problems.

SUMMARY OF THE INVENTION

An aspect of the present invention is to provide a triangular wave generating circuit providing clock synchronization.

According to one embodiment of the present invention, the triangular wave generating circuit comprises a capacitor, first, second, third, and fourth constant current sources, first and second switching units, a high/low level limiter, a clock generator, and a phase detecting unit. The capacitor has an output for providing a triangular wave signal. The first and second constant current sources are configured to charge the capacitor. The third and fourth constant current sources are configured to discharge the capacitor. The first switching unit comprises a first switch and a second switch. The first switching unit is configured to couple the first and third constant current sources to the capacitor in response to an internal clock signal. The high/low level limiter comprises first and second comparing units. The first comparing unit is configured to compare the triangular wave signal with an upper limit reference voltage and generate an output signal when the triangular wave signal coincides with the upper limit reference voltage. The second comparing unit is configured to compare the triangular wave signal with a lower limit reference voltage and generate an output signal when the triangular wave signal coincides with the lower limit reference voltage. The clock generator is configured to generate the internal clock signal in response to the output signals from the first and second comparing units. The phase detecting unit is configured to compare an externally supplied clock signal with the internal clock signal and generate a first phase signal and a second phase signal base on a phase difference between the externally supplied clock signal and the internal clock signal. The second switching unit comprises a third switch and a fourth switch. The third switch is configured to couple the second constant current source to the capacitor in response to the first phase signal. The fourth switch is configured to couple the fourth constant current source to the capacitor in response to the second phase signal.

BRIEF DESCRIPTION OF THE DRAWINGS

The invention will be described according to the appended drawings in which.

DETAILED DESCRIPTION OF THE INVENTION

Figure 3:
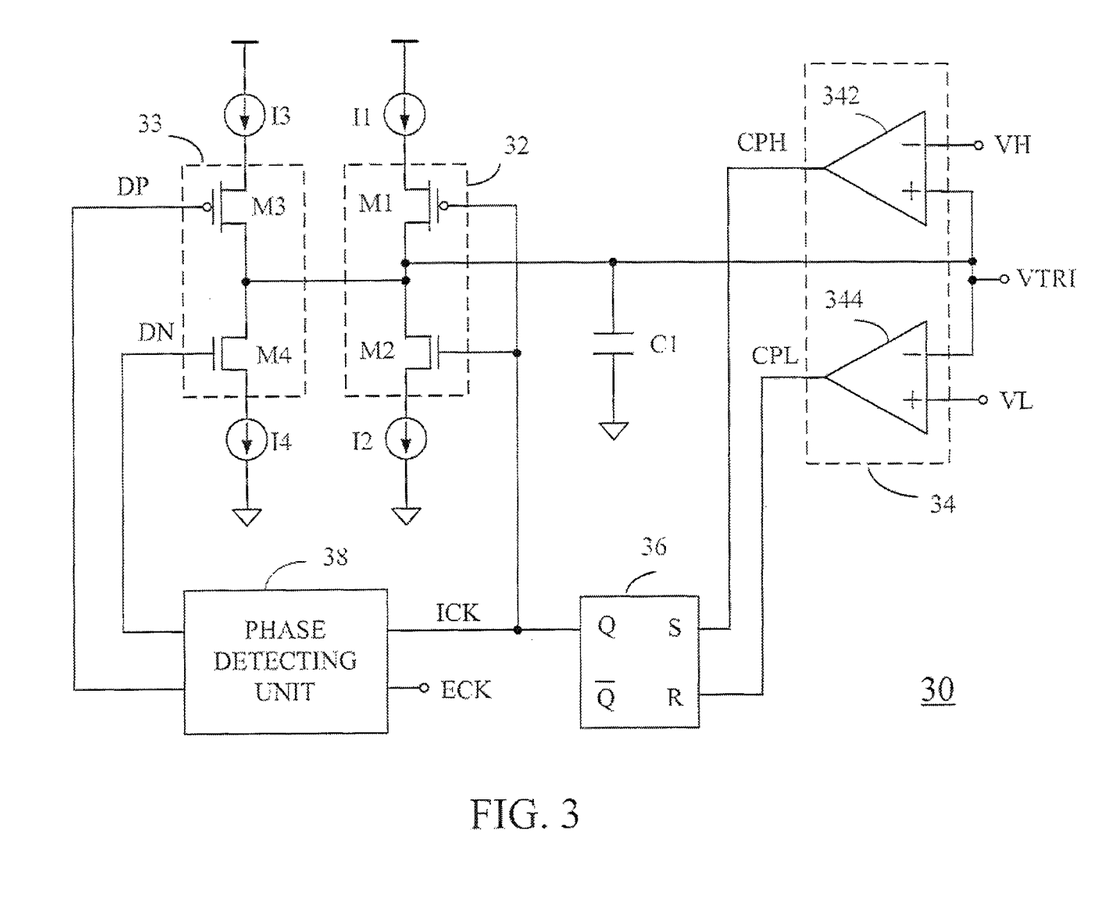
FIG. 3 shows a block diagram of a triangular wave generating circuit according to one embodiment of the present invention.

FIG. 3 shows a block diagram of a triangular wave generating circuit 30 according to one embodiment of the present invention. The triangular wave generating circuit 30 comprises a capacitor C1, a pair of matching charge/discharge constant current sources I1 and I2, and a switching unit 32. The switching unit 32 comprises two switches M1 and M2 controlled by an internal clock signal ICK. The switches M1 and M2 are switched in a complementary fashion such that when the switch M1 is turned on, the switch M2 is turned off, and vice versa. In addition, when the switch M1 is turned on, the constant current source I1 is coupled to the capacitor C1. When the switch M2 is turned on, the constant current source I2 is coupled to the capacitor C1.

Referring to FIG. 3, the triangular wave generating circuit 30 further comprises a high/low level limiter circuit 34 including two comparators 342 and 344. The comparator 342 compares a signal VTRI on the capacitor C1 with an upper limit reference voltage VH, and the comparator 344 compares the signal VTRI with a lower limit reference voltage VL. The output signal CPH of the comparator 342 and the output signal CPL of the comparator 344 are provided to an internal clock generator 36, which, in the illustrated embodiment, includes a SR latch. Thereafter, the clock generator 36 provides the clock signal ICK for controlling the switches M1 and M2 of the switching unit 32 base on the comparison result.

Referring to FIG. 3, the triangular wave generating circuit 30 further comprises a pair of matching charge/discharge constant current sources I3 and I4, and a switching unit 33 including two switches M3 and M4. The switch M3 is controlled by an output signal DP from a phase detecting unit 38, and the switch M4 is controlled by an output signal DN from the phase detecting unit 38. When the switch M3 is turned on, the switch M4 is turned off. Vice versa, when the switch M4 is turned on, the switch M3 is turned off. In addition, when the switch M3 is turned on, the constant current source I3 is coupled to the capacitor C1. When the switch M4 is turned on, the constant current source I4 is coupled to the capacitor C1.

As mentioned above, the operation of the switching unit 33 is controlled by the phase detecting unit 38. The phase detecting unit 38 compares an externally supplied clock signal ECK with the internal clock signal ICK and generates phase signals DP and DN base on a phase difference between the clock signal ECK and the clock signal ICK. When the signal DP goes low, the switch M3 of the switching unit 33 is turned on. When the signal DN goes high, the switch M4 of the switching unit 33 is turned on.

Figure 4:
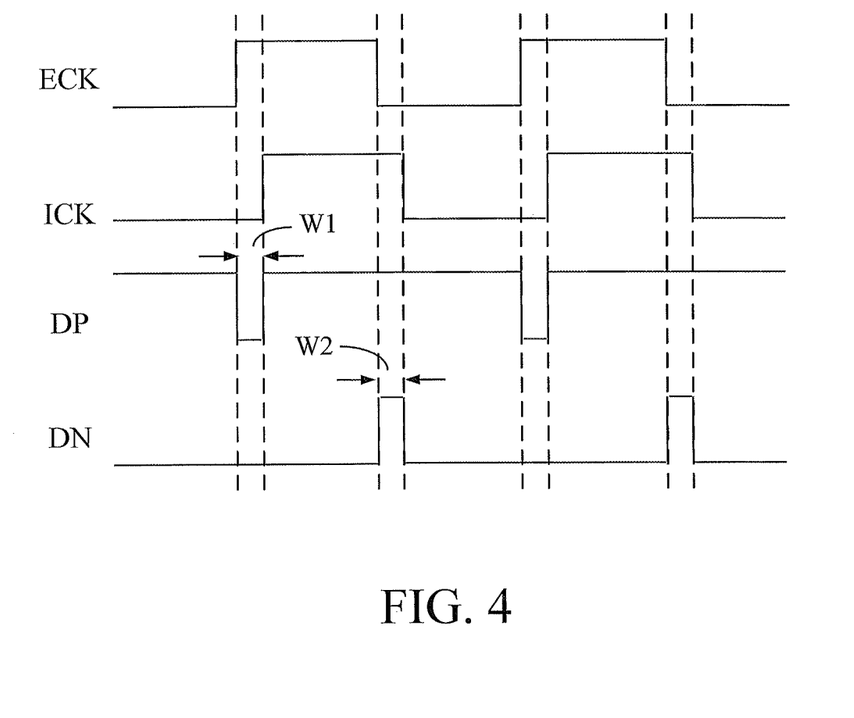
FIG. 4 is an operation waveform of the phase detecting unit in a case in which a phase of the clock signal ECK leads a phase of the clock signal ICK.

FIG. 4 is an operation waveform of the phase detecting unit 38 in a case in which a phase of the clock signal ECK leads a phase of the clock signal ICK. Referring to FIG. 4, the phase detecting unit 38 generates the phase signal DP when the rising edge of the clock signal ECK leads a rising edge of the clock signal ICK, and generates the phase signal DN when the falling edge of the clock signal ECK leads a falling edge of the clock signal ICK. Therefore, the pulse width W1 of phase signal DP and the pulse width W2 of phase signal DN are determined base on the phase difference between the clock signal ECK and the clock signal ICK.

Figure 5:
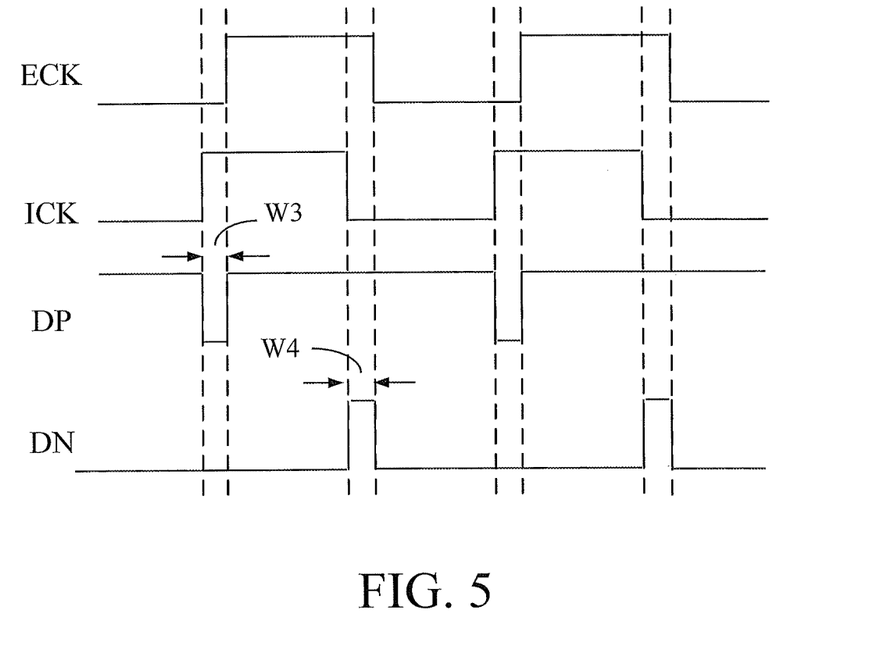
FIG. 5 is an operation waveform of the phase detecting unit in a case in which a phase of the clock signal ECK lags a phase of the clock signal ICK.

FIG. 5 is an operation waveform of the phase detecting unit 38 in a case in which a phase of the clock signal ECK lags a phase of the clock signal ICK. Referring to FIG. 5, the phase detecting unit 38 generates the phase signal DP when the rising edge of the clock signal ECK lags a rising edge of the clock signal ICK, and generates the phase signal DN when the falling edge of the clock signal ECK lags a falling edge of the clock signal ICK. Therefore, the pulse width W3 of phase signal DP and the pulse width W4 of phase signal DN are determined base on the phase difference between the clock signal ECK and the clock signal ICK.

Figure 6:
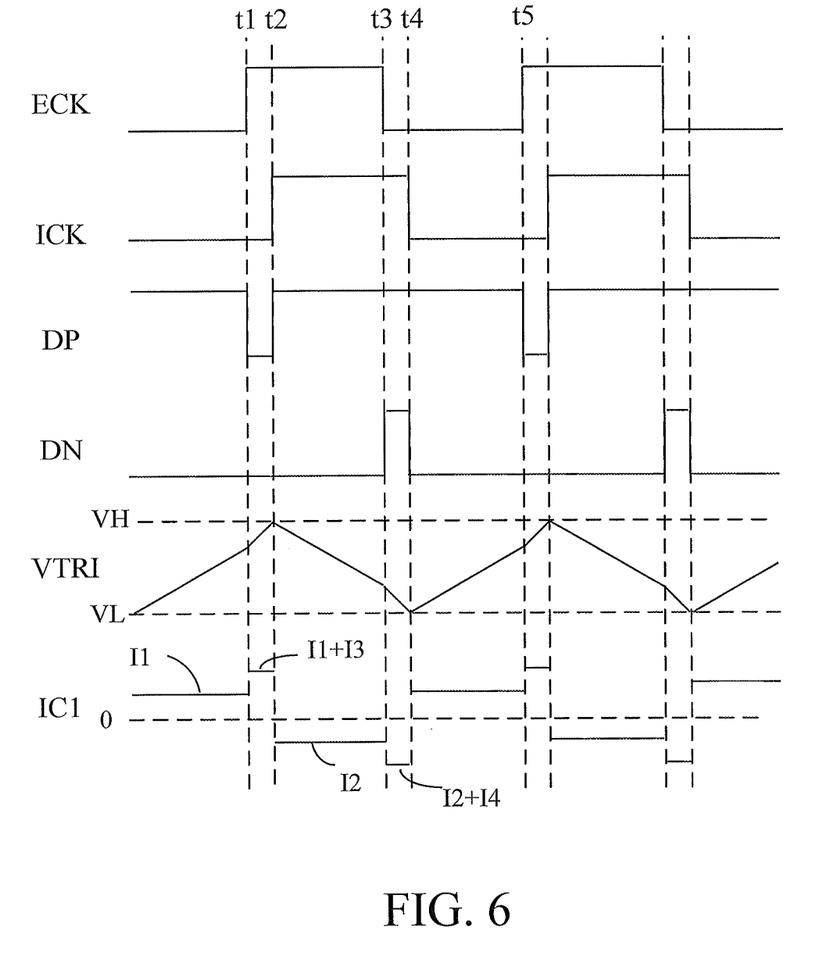
FIG. 6 is a waveform diagram showing the operation of the triangular wave generating circuit according to one embodiment of the present invention.

The present invention will now be discussed in detail with respect to FIG. 3-FIG. 7. FIG. 6 is a waveform diagram showing the operation of the triangular wave generating circuit 30 according to one embodiment of the present invention.

In this embodiment, the phase of the clock signal ECK leads the phase of the clock signal ICK.

Referring to FIG. 6, before the time t1, when the clock signal ICK is low, the capacitor C1 is charged by the current flowing in the constant current source I1, causing the voltage VTRI on the capacitor C1 to rise linearly. At the time t1, the phase detecting unit 38 detects the phase difference between the clock signal ECK and the clock signal ICK and generates the phase signal DP in response to the rising edge of the clock signal ECK leading a rising edge of the clock signal ICK. This causes the constant current source I3 to charge the capacitor C1. Since the slope of the rising segment of the triangle waveform is directly proportional to the DC current applied to the capacitor, the signal VTRI reaches the upper limit reference voltage VH rapidly at the time t2. When the signal VTRI reaches VH, the output signal CPH of the comparator 342 goes high, causing the RS latch 36 to force ICK high.

After the time t2, the switches M1 and M3 are turned off and the capacitor C1 is discharged by the current flowing in the constant current source I2 in response to the clock signal ICK. This causes the voltage VTRI on the capacitor C1 to fall linearly. At the time t3, the phase detecting unit 38 detects the phase difference between the clock signal ECK and the clock signal ICK and generates the phase signal DN in response to the falling edge of the clock signal ECK leading a falling edge of the clock signal ICK. This causes the constant current source I4 to cooperate with the current source I2 to discharge the capacitor C1. Higher DC current results in a shorter ramp time interval. Therefore, the signal VTRI reaches the lower bias voltage VL rapidly at the time t4. When the signal VTRI reaches VL, the output signal CPL of the comparator 344 goes high, causing the RS latch 36 to force ICK low.

The aforementioned operation is repeated, and as a result, the output voltage VTRI on the capacitor C1 is obtained in the form of a triangular wave. As described in detail above, the triangular wave generating circuit 30 synchronizes the internal clock signal ICK with the externally provided clock signal ECK by detecting the phase difference between the clock signal ECK and the clock signal ICK. When the phase of the clock signal ECK leads the phase of the clock signal ICK, the slope of the signal VTRI increases base on the detection, thereby reducing the ramp period. In this manner, the internal clock signal ICK is synchronized to the external clock signal ECK after several cycles.

Figure 7:
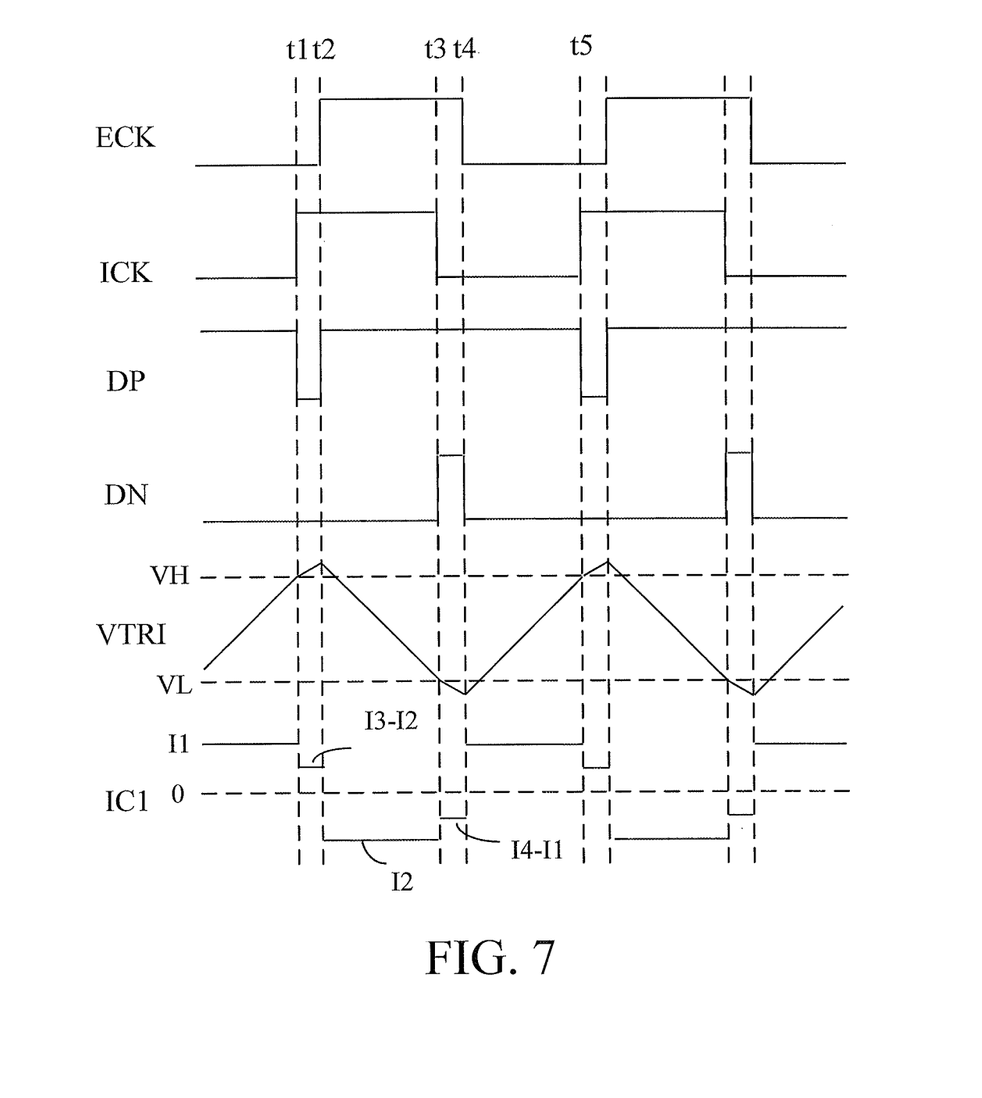
FIG. 7 is an another operation waveform showing the operation of the triangular wave generating circuit of FIG. 3 in a case in which the phase of the clock signal ECK lags that of the clock signal ICK.

FIG. 7 is an another operation waveform showing the operation of the triangular wave generating circuit 30 of FIG. 3 in a case in which the phase of the clock signal ECK lags that of the clock signal ICK. Referring to FIG. 7, when the clock signal ICK is low before the time t1, the capacitor C1 is charged by the current flowing in the constant current source I1, causing the voltage VTRI on the capacitor C1 to rise linearly. At the time t1, the signal VTRI reaches the upper bias voltage VH of the comparator 342, causing RS latch 36 to force ICK High. Therefore, the switch M1 is turned off and the switch M2 is turned on, respectively, which causes the current source I2 couple to the capacitor C1. After the time t1, the phase detecting unit 38 detects the phase difference between the clock signal ECK and the clock signal ICK and generates the phase signal DP base on the detection, which causes the constant current source I3 to couple to the capacitor C1. In this embodiment, the current value of the current source I3 is larger than that of the current source I2. Therefore, the capacitor C1 is charged by the net current I3-I2.

When the clock signal ECK goes high at the time t2, the phase signal DP goes back to a high state. Then, the switch M3 is turned off and the capacitor C1 is discharged by the current flowing in the constant current source I2. This causes the voltage VTRI on the capacitor C1 to fall linearly. At the time t3, the signal VTRI reaches the lower bias voltage VL of the comparator 344, causing the RS latch 36 to force ICK low. Therefore, the switch M2 is turned off and the switch M1 is turned on, respectively, which causes the constant current source I1 to couple to the capacitor C1. After the time t3, the phase detecting unit 38 detects the phase difference between the clock signal ECK and the clock signal ICK and generates the phase signal DN base on the detection. This causes the constant current source I4 to begin discharging the capacitor C1. In this embodiment, the current value of the current source I4 is larger than that of the current source I1. Therefore, the capacitor C1 is discharged by the net current I4-I1.

At the time t4, the clock signal ECK goes low, and thus the phase signal DN goes back to a low state. Then, the switch M4 is turned off and the capacitor C1 is charged by the current flowing in the constant current source I1. The capacitor C1 is charged and discharged in the similar manner after the time t5, and thus the output voltage VTRI on the capacitor C1 is obtained in the form of a triangular wave.

As described in detail above, the triangular wave generating circuit 30 synchronizes the internal clock signal ICK with the externally provided clock signal ECK by detecting the phase difference between the clock signal ECK and the clock signal ICK. When the phase of the clock signal ECK lags the phase of the clock signal ICK, the capacitor C1 remains previous charging/discharging status during the phase difference time. This results in a longer ramp period since the slope of the signal VTRI is smaller. In this manner, the internal clock signal ICK is synchronized to the external clock signal ECK after several cycles.

Figure 8:
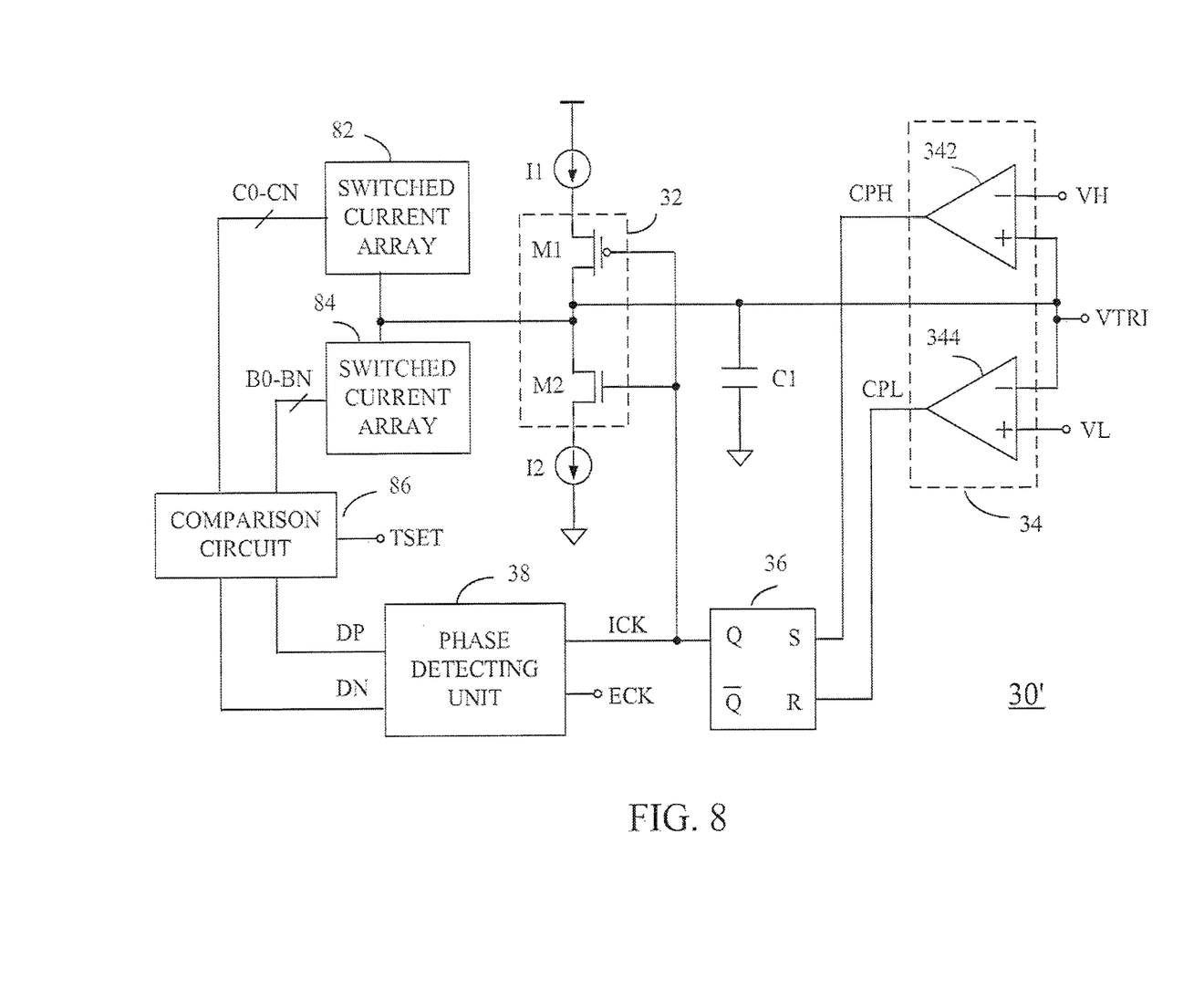
FIG. 8 shows a block diagram of a triangular wave generating circuit according to another embodiment of the present invention.

In the above embodiments, the capacitor C1 is additionally charged and discharged by the constant current sources I3 and I4. However, the capacitor C1 can be additionally charged and discharged by the varied current sources according to the phase difference time. FIG. 8 shows a block diagram of a triangular wave generating circuit 30' according to another embodiment of the present invention. Referring to FIG. 8, a comparison circuit 86 compares the pulse width of the signal DP with a predetermined time interval TSET and generates a digital code consisting of a plurality of bits C0-CN; meanwhile, the comparison circuit 86 compares the pulse width of the signal DN with the time interval TSET and generates a digital code consisting of a plurality of bits B0-BN.

Figure 9:
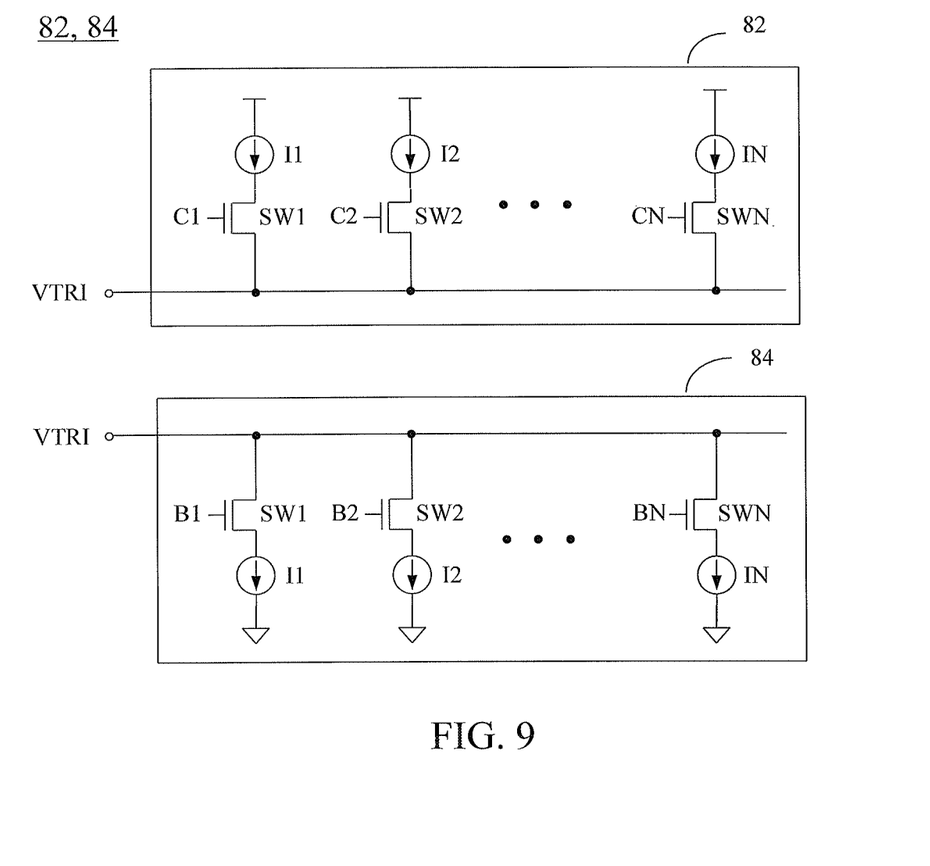
FIG. 9 shows a circuit diagram of the current arrays of FIG. 8 according to one embodiment of the present invention.

Referring to FIG. 8, a current array 82 receives the digital bits C0-CN and provides the charging current derived from the bits C0-CN. A current array 84 receives the digital bits B0-BN and provides the discharging current derived from the bits B0-BN. FIG. 9 shows a circuit diagram of the current arrays 82 and 84 of FIG. 8 according to one embodiment of the present invention. Referring to FIG. 9, the current array 82 comprises a plurality of identical current sources I1 to IN. Each current source passes a substantially constant current I. The current array 82 further comprises a plurality of switches SW1 to SWN corresponding respectively to the n current sources I1 to IN. The circuit configuration of the current array 84, which is similar to that of the current array 82, comprises a plurality of identical current sources I1 to IN and a plurality of switches SW1 to SWN corresponding respectively to the plurality of current sources I1 to IN.

Figure 10:
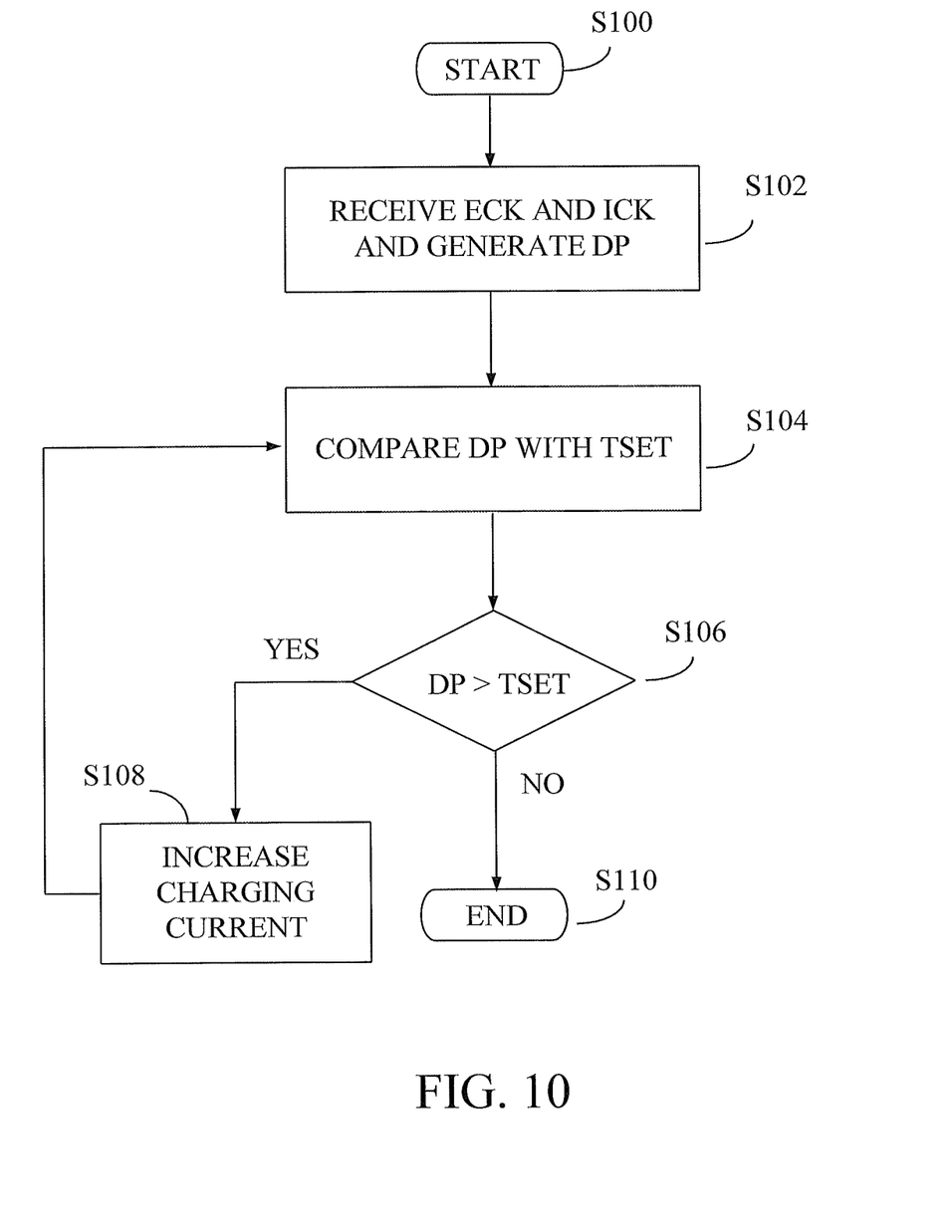
FIG. 10 is a flowchart showing an operation of the triangular wave generating circuit of FIG. 8 according to one embodiment of the present invention.

FIG. 10 is a flowchart showing an operation of the triangular wave generating circuit 30' of FIG. 8 according to one embodiment of the present invention. Referring to FIG. 8 to FIG. 10, in step S100, the flow starts. Then, in step S102, the phase detecting unit 38 detects the phase difference between the clock signal ECK and the clock signal ICK and generates the phase signals DP/DN base on the detection. In step S104, the comparison circuit 86 compares the pulse width of the signal DP with a predetermined time interval TSET to generate the digital bits C0-CN. According to one embodiment of the present invention, the digital bits C0-CN are generated base on the phase difference between the pulse width of the signal DP and the predetermined time interval TSET. According to another embodiment of the present invention, the comparison circuit 86 compares the pulse width of the signal DP with a plurality of predetermined time intervals to generate the digital bits C0-CN.

Then, in step S106, if DP>TSET, the sum of the respective currents from the current array 82 are increased to charge the capacitor C1, and the procedure returns to step S104. Otherwise, if DP<TSET, the flow ends in step S110.

In one embodiment of FIG. 10, the capacitor C1 is only charged by one current source of the current array 82 and discharged by one current source of the current array 84 in the beginning. Next, in step S106, if the pulse width of the signal DP remains larger than the time interval TSET (e.g., 100 ns) after several clock cycles, another current source of the current array 82 is connected to the capacitor C1 so as to increase the charging current. After several clock cycles, the comparison circuit 86 compares the pulse width of the signal DP with the predetermined time interval TSET again. If DP>TSET, indicating that the additional charging current is not large enough to reduce the phase difference between the clock signal ICK and the clock signal ECK, and thus another current source of the current array 82 is required to increase the sum of the charging current. The current sources of the current array 82 continuous to increase every several clock cycles until DP<TSET. In this manner, the pulse width of the signal DP can be less than the time interval TSET.

In the above embodiment, the plurality of switched SW1 to SWN of the current array 82 are sequentially turned on to increase the total charging current, and only one switch SW1 of the current array 84 is turned on to conduct the current source. However, in another embodiment of the present invention, the plurality of switched SW1 to SWN of the current array 84 are sequentially turned on to increase the total discharging current, and only one switch SW1 of the current array 82 is turned on to conduct the current source. In yet another embodiment of the present invention, the plurality of switched SW1 to SWN of the current array 82 and the plurality of switched SW1 to SWN of the current array 84 are sequentially turned on to increase the total charging and discharging current base on the phase difference between the pulse width of the signal DP and the predetermined time interval TSET. In this manner, the phase detecting unit 38 gradually reduces the pulse width of the signal DP until it less than the time interval TSET.

The above-described embodiments of the present invention are intended to be illustrative only. Numerous alternative embodiments may be devised by those skilled in the art without departing from the spirit and scope of the invention as recited in the following claims.

What is claimed is:

1. A triangular wave generating circuit, comprising:
   a capacitor having an output for providing a triangular wave signal;
   first and second constant current sources configured to charge the capacitor;
   third and fourth constant current sources configured to discharge the capacitor;
   a first switching unit comprising a first switch and a second switch, the first switching unit configured to couple the first and third constant current sources to the capacitor in response to an internal clock signal;

a high/low level limiter comprising first and second comparing units, the first comparing unit configured to compare the triangular wave signal with an upper limit reference voltage and generate an output signal when the triangular wave signal coincides with the upper limit reference voltage, the second comparing unit configured to compare the triangular wave signal with a lower limit reference voltage and generate an output signal when the triangular wave signal coincides with the lower limit reference voltage;

a clock generator configured to generate the internal clock signal in response to the output signals from the first and second comparing units;

a phase detecting unit configured to compare an externally supplied clock signal with the internal clock signal and generate a first phase signal and a second phase signal base on a phase difference between the externally supplied clock signal and the internal clock signal; and a second switching unit comprising a third switch and a fourth switch, the third switch configured to couple the second constant current source to the capacitor in response to the first phase signal, the fourth switch configured to couple the fourth constant current source to the capacitor in response to the second phase signal.

2. The triangular wave generating circuit of claim 1, wherein the phase detecting unit generates the first phase signal when a rising edge of the externally supplied clock signal leads a rising edge of the internal clock signal.

3. The triangular wave generating circuit of claim 1, wherein the phase comparing unit generates the second phase signal when a falling edge of the externally supplied clock signal leads a falling edge of the internal clock signal.

4. The triangular wave generating circuit of claim 1, wherein the current value of the second current source is larger than that of the third current source, and the phase comparing unit generates the first phase signal when a rising edge of the externally supplied clock signal lags a rising edge of the internal clock signal.

5. The triangular wave generating circuit of claim 1, wherein the current value of the fourth current source is larger than that of the first current source, and the phase comparing unit generates the second phase signal when a falling edge of the externally supplied clock signal lags a falling edge of the internal clock signal.

6. The triangular wave generating circuit of claim 1, further comprising:

a first comparison circuit configured to compare the first phase signal with a plurality of predetermined time intervals and generate a first digital code when the pulse width of the first phase signal is larger than the predetermined time interval; and a first current array comprising a plurality of identical current sources and a plurality of switches corresponding respectively to the plurality of current sources;

wherein the plurality of current sources of the first current array are sequentially coupled to the capacitor in response to the first digital code.

7. The triangular wave generating circuit of claim 1, further comprising:

a second comparison circuit configured to compare the second phase signal with a plurality of predetermined time intervals and generate a second digital code when the pulse width of the second phase signal is larger than the predetermined time interval; and a second current array comprising a plurality of identical current sources and a plurality of switches corresponding respectively to the plurality of current sources;

wherein the plurality of current sources of the second current array are sequentially coupled to the capacitor in response to the second digital code.

8. The triangular wave generating circuit of claim 1, further comprising:

a first comparison circuit configured to compare the first phase signal with a predetermined time interval and generates a first digital code base on the phase difference between the pulse width of the first phase signal and the predetermined time interval; and a first current array comprising a plurality of identical current sources and a plurality of switches corresponding respectively to the plurality of current sources;

wherein the plurality of current sources of the first current array are sequentially coupled to the capacitor in response to the first digital code.

9. The triangular wave generating circuit of claim 1, further comprising:

a second comparison circuit configured to compare the second phase signal with a predetermined time interval and generates a second digital code base on the phase difference between the pulse width of the second phase signal and the predetermined time interval; and a second current array comprising a plurality of identical current sources and a plurality of switches corresponding respectively to the plurality of current sources;

wherein the plurality of current sources of the second current array are sequentially coupled to the capacitor in response to the second digital code.

* * * * *